May 27, 1969

C. R. BOYKIN 3,447,035

CIRCUITRY FOR PROTECTING A PUSH-PULL SWITCHING DRIVER STAGE UPON OCCURRENCE OF A SHORT CIRCUIT AT THE OUTPUT THEREOF

Filed July 28, 1966

WITNESSES

Edwin E. Bassler

James F. Young

INVENTOR

Curtis R. Boykin

BY F. H. Henson

ATTORNEY

United States Patent Office 3,447,035

Patented May 27, 1969

3,447,035

CIRCUITRY FOR PROTECTING A PUSH-PULL SWITCHING DRIVER STAGE UPON OCCURRENCE OF A SHORT CIRCUIT AT THE OUTPUT THEREOF

Curtis R. Boykin, Severna Park, Md., assignor to Westinghouse Electric Corporation, Pittsburgh, Pa., a corporation of Pennsylvania Filed July 28, 1966, Ser. No. 568,667
Int. Cl. H02h 3/16, 7/20
U.S. Cl. 317—31 4 Claims

ABSTRACT OF THE DISCLOSURE

A short sensing transistor is connected to a push-pull complementary pair output driver stage with the three elements of the transistor moving up and down together in voltage under fault free operation so as to have negligible effect but when a short circuit occurs, the emitter element is grounded forcing the control electrodes of the driver stage to a back bias sufficient to turn off the driver stage. Another transistor is connected to also operate as a grounded emitter stage to latch the first transistor in its operating position as long as the short circuit exists.

Figure 1:
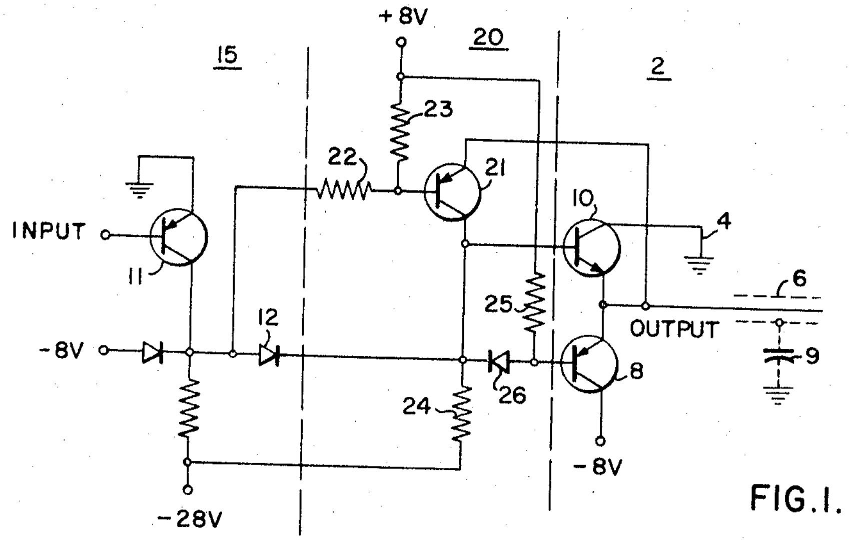

The present invention relates generally to overload protection circuitry and more particularly relates to circuitry for protecting a push-pull switching driver stage upon occurrence of a short circuit at the output thereof.

Since the advent of the push-pull complementary pair output driver stage, serious failures have resulted from short circuiting. One of the switching devices of the complementary pair is always tied directly to a power bus so that when a short does occur the switching device is likely to fail. In many times the input stage to the driver stage is also damaged.

The push-pull switching output stage may drive for example, a long coaxial line leading to logic blocks some distance away. Such coaxial line is susceptible to abuse which can result in the line becoming grounded. When such a fault occurs, the driving stage can become over driven resulting in the failure of relatively expensive switching devices.

An object of the present invention is to provide circuitry for protecting a push-pull driver stage in an inexpensive manner.

Another object of the present invention is to provide short sensing circuitry for protecting a push-pull switching driver stage with no degradation of circuit performance rise and fall times.

Another object of the present invention is to provide short sensing circuitry with little additional power requirements.

Another object of the present invention is to provide short sensing circuitry allowing full drive capabilities across the system power buses.

Another object of the present invention is to provide short sensing circuitry for a push-pull switching driver stage with no degradation of base drive resulting from the use of such circuitry.

Briefly, the present invention accomplishes the above cited objects by providing short sensing transistor means, the emitter of which is connected to follow the output of the driver stage and the base and collector connected to follow the input to the driver stage. During fault free operation, all three elements of the transistor move up and down together in voltage so that the effect of the transistor upon circuit operation is negligible. When a short condition occurs, the emitter of the transistor is grounded resulting in a saturated grounded emitter stage which forces the control elements of the push-pull output driver stage to a back bias sufficient to turn off both switching devices of the complementary pair. Additional transistor means may be connected to follow the output of the driver stage and also operate as a grounded emitter stage upon occurrence of a ground condition at the output of the driver. The second transistor means is connected to input stage for latching the output thereof to maintain the first transistor means conducting as long as the harmful load condition exists.

Figure 2:
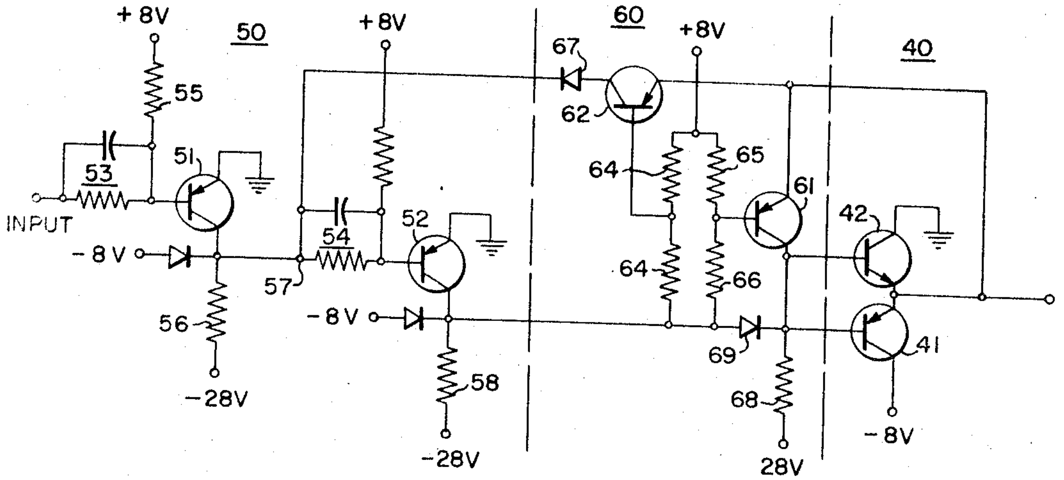

Further objects and advantages of the present invention will become readily apparent from the following detailed description taken in conjunction with the drawing, in which:

FIGURE 1 is an electrical schematic diagram of an illustrative embodiment of the present invention; and FIG. 2 is an electrical schematic diagram of an alternate embodiment of the present invention.

A push-pull driver stage 2 is illustrated in FIG. 1 providing a point of reference potential or ground 4 or a negative potential, illustrated as —8 volts, to a coaxial line 6 which may connect to logic circuitry of the negative potential type. The switching devices 8 and 10 are illustrated as transistors of a complementary pair.

An inverter input stage 15 controls the output of the driver stage 2. When transistor 11 is non-conductive the switching device 8 is rendered conductive by a negative signal of a magnitude defined by the diode 12. When an input to the inverter stage 15 renders the transistor 11 conductive, the inherent capacitance in the coaxial line 6, illustrated in a lumped capacitor 9 delays the emitter of the switching device 8 slightly and the positive going spike at the base of the switching device 10 will render that device conductive thereby grounding the output of the driver stage 2.

It can be seen however that as the transistor 11 becomes non-conductive a voltage drive of 8 volts is provided into the push-pull driver circuit 2 and when a short circuit is present in the output thereof, the switching devices 8 and 10 can be over driven and hence be damaged, possibly being blown up.

A circuit 20 is inserted to sense such a short circuit. Transistor 21 is connected with its emitter to the output of the driver stage 2 and its base and collector connected to the input of the driver circuit 2. The base electrode is connected to the input stage through resistor 22. A resistive element 23 connects the base electrode to a source of positive potential for biasing the transistor 21 to its non-conducting state. Resistance element 24 connects the collector electrode to a negative source of potential. A resistor 25 and diode 26 connect the positive potential supply to the switching device 8 to back bias the switching device 8 to its non-conducting state in the absence of an input to the device 8 when transistor 11 is conductive.

Under normal operating conditions, the elements short sensing transistor 21 all move up and down together with respect to voltage to have little effect upon operation of the circuit.

However, when a short circuit condition occurs at the output of the driver stage 2, the input to the driver 2 is still allowed to swing negative by the unidirectional characteristics of the diode 26. The emitter of the transistor 21 is at ground potential and thus operates as a saturated grounded emitter stage which forces the control electrode of the switching device 8 sufficiently positive to back bias or ground the input to the driver stage 2 when the inverter input stage 10 seeks to provide a negative input of —8 volts.

Thus, both switching devices of the driver stage 2 are back biased and non-conducting when a short has occurred except possibly during very narrow transient conditions caused by the finite time delays through the various stages. Since the fault sensing transistor 21 is chosen to be an inexpensive slow device and is normally off biased, a finite time will elapse before it can react and back bias the output stage 2. During this transient condition the output transistor 8 will be delivering current and being stressed but only within its safe operating abilities.

The illustrative embodiment of FIG. 1 provides adequate protection at lower repetition rates and wider pulse widths. The embodiment of FIG. 2 illustrates circuitry capable of protecting output driver stages at greatly increased repetition rates.

Once again a driver stage 40 is illustrated with switching devices 41 and 42 of the complementary type connected in push-pull arrangement to provide a point of reference or ground potential and a negative potentinal illustrated as —8 volts to logic circuits connected to the output therof.

An input stage 50 is illustrated with two inverting stages including transistors 51 and 52 respectively. RC circuits 53 and 54 provided fast rise times to input signals applied to the transistors 51 and 52 respectively. A resistive element 55 connects the base electrode of the transistor 51 to a source of positive potential biasing the transistor 51 to its non-conducting state. As a result, a negative potential through a resistor element 56 appears at the base electrode of the transistor 52 rendering it conductive. Alternatively, the transistor 52 will be in its non-conducting state when the transistor 51 is conducting in response to a negative input signal to the input stage 20.

A short sensing circuit 60 includes a first transistor 61 connected as an emitter follower as in the illustration of FIG. 1. A second transistor 62 is also connected as a emitter follower stage with its base electrode connected to respond to a voltage determined by a voltage divider made up of resistors 63 and 64. The base electrode of the first transistor 61 is connected in similar fashion to a voltage divider including resistors 65 and 66. A diode 67 isolates the collector of the transistor 62 from the positive voltage pulses which normally occur during operation.

Under normal operating conditions it can be seen that the transistors 61 and 62 float with the voltage changes resulting from the driver circuit 40 switching from zero volts to —8 volts. However, when a low impedance or a short circuit is applied across the output of the driver stage, the voltage drop across the switching device 41 increases and the negative potential source connected through resistive element 68 seeks to drive the switching device 41 harder and harder. Hence the voltage across the voltage divider circuit will become greater and when its magnitude exceeds a predetermined value determined by the relationship of the magnitude of the resistors 63 through 66, transistors 61 and 62 will begin to conduct. As a grounded emitter stage the transistor 61 will go into saturation thus biasing off the switching devices 41 and 42. Transistor 62 conducts in the same manner and forms a latch around the transistor 52 in the input stage by grounding the junction 57. As a result a constant negative base drive through resistive element 58 locks the transistor 61 in its conductive state. Thus, as long as the low impedance is present on the output of the driver stage 40, a constant latch out is provided after a single pulse of current.

The overload setting at which the latch out will occur can be preset by varying the magnitude of the resistors 63 through 66 in the voltage divider network.

The elements which make up the monitoring circuit can be relatively inexpensive with the transistors 61 and 62 of slow response and the diodes 67 and 69 being of germanium, for example. The total cost is considerably less than the cost of any one of the three output active elements 41, 42 and 52 which can be destroyed each time such a circuit is overloaded without the provided protection.

Line driver circuits incorporating the present invention have been built and tested to 67° C. for slow speeds have a rise and fall time of 50 nanoseconds and for high speeds of 10 nanoseconds rise and fall times with pulse width as small as 60 nanoseconds. The present invention makes it economically practical to drive a coaxial line output feeding the logic circuitry which may be a considerable distance from the output driver.

While the present invention has been described with a degree of particularity for the purposes of illustration, it is to be understood that all modifications, alterations and substitutions within the spirit and scope of the present invention are herein meant to be included.

I claim as my invention:

1. In combination; a push-pull switching driver stage including first and second switching means; means for connecting a voltage source to the output of said driver stage when said first switching means is rendered conductive; means for grounding the output of said driver stage in response to said second switching means being rendered conductive; means for biasing one of the switching means on and the other off; an input stage responsive to an input signal for overcoming said means for biasing and driving said one of the switching means off and said other switching means on; first transistor means including an emitter element connected to follow the output of said driver stage and a base element and a collector element connected to follow the input to said driver stage, the elements of said transistor means following voltage changes with little voltage difference therebetween under normal conditions; and means responsive to the overdriving of said first switching means upon occurrence of a ground condition at the output of said driver stage for driving said transistor means conductive; said transistor means responsive to said ground conditions for back biasing said driver stage to a nonconducting state.

2. The circuitry of claim 1 including second transistor means connected to follow the output of said driver stage and become a grounded emitter stage upon occurrence of said ground condition and also being responsive to the over driving of said first switching means for latching said input stage to maintain said first transistor means conductive.

3. The circuitry of claim 1 wherein said means for driving said first transistor means conductive includes voltage divider means for driving said first transistor means conductive in response to the over driving of said first switching means exceeding a predetermined value.

4. The circuitry of claim 2 including unidirectional conduction means connecting said second transistor means to said input stage to isolate said second transistor means therefrom during normal operation of said circuit.

References Cited

UNITED STATES PATENTS

| | | | |
|---|---|---|---|
| 3,109,981 | 11/1963 | Muchnick | 317—33 |
| 3,131,344 | 4/1964 | Rosenfeld et al. | 317—33 |
| 3,343,037 | 9/1967 | Kutz | 317—33 |

JOHN F. CONCH, *Primary Examiner.*

R. V. LUPO, *Assistant Examiner.*

U.S. Cl. X.R.

317—33